(12) United States Patent
Kanamoto et al.

(10) Patent No.: US 9,405,873 B2
(45) Date of Patent: Aug. 2, 2016

(54) METHOD FOR IMPROVED ACCURACY OF A SUBSTRATE PARASITIC-RESISTANCE EXTRACTION IN A CIRCUIT SIMULATION

(71) Applicant: RENESAS ELECTRONICS CORPORATION, Kanagawa (JP)

(72) Inventors: Toshiki Kanamoto, Kanagawa (JP); Hisato Inaba, Hyogo (JP)

(73) Assignee: Renesas Electronics Corporation, Tokyo (JP)

( * ) Notice: Subject to any disclaimer, the term of this patent is extended or adjusted under 35 U.S.C. 154(b) by 840 days.

(21) Appl. No.: 13/691,900

(22) Filed: Dec. 3, 2012

(65) Prior Publication Data

US 2013/0151226 A1 Jun. 13, 2013

(30) Foreign Application Priority Data

Dec. 12, 2011 (JP) ................................. 2011-271228

(51) Int. Cl.
*G06F 17/50* (2006.01)
(52) U.S. Cl.
CPC .................................. *G06F 17/5036* (2013.01)
(58) Field of Classification Search
CPC .................................................. G06F 17/5036
USPC ............................................................ 703/14
See application file for complete search history.

(56) References Cited

U.S. PATENT DOCUMENTS

| | | | |
|---|---|---|---|
| 6,212,492 B1 | 4/2001 | Kuge | |
| 6,720,618 B2 | 4/2004 | Kawaguchi et al. | |
| 7,211,870 B2 * | 5/2007 | Ohkubo | H01L 27/0928 257/206 |
| 7,645,664 B1 * | 1/2010 | Pelham | G11C 5/146 257/371 |
| 7,755,147 B2 * | 7/2010 | Satoh | H01L 21/823892 257/203 |
| 2001/0029601 A1 * | 10/2001 | Kimura | G06F 17/5036 716/55 |
| 2002/0022951 A1 | 2/2002 | Heijningen et al. | |
| 2009/0006065 A1 * | 1/2009 | Kariat | G06F 17/5036 703/14 |

FOREIGN PATENT DOCUMENTS

| | | |
|---|---|---|
| JP | 10-50849 A | 2/1998 |
| JP | 2002-158284 A | 5/2002 |
| JP | 2003-152180 A | 5/2003 |

OTHER PUBLICATIONS

Liu, Jun, and Marissa Condon. "A scalable model of the substrate network in deep N-Well RF MOSFETs with multiple fingers." Circuits and Systems 2.02 (2011): 91.*
Png, Lih Chieh, Kok Wai Chew, and Kiat Seng Yeo. "Impact of forward and reverse deep n-well biasing on the 1/f noise of 0.13 µm n-channel MOSFETs in triple well technology." Solid-State Electronics 53.6 (2009): 599-606.*

* cited by examiner

*Primary Examiner* — Aniss Chad
(74) *Attorney, Agent, or Firm* — Mattingly & Malur, PC

(57) ABSTRACT

By considering a Deep Nwell diffusing into a Pwell region, accuracy of a substrate parasitic-resistance extraction is improved. A well region of a semiconductor integrated circuit where a Pwell and a Deep Nwell are formed in a substrate is divided into two or more meshes each including two or more resistor segments and a substrate noise is analyzed based thereon. In this regard, parallel components of resistors coupling the Pwell with the substrate are deleted in accordance with a state of the Deep Nwell diffusing into the Pwell region, so that an arithmetic processing unit executes a process for expressing a rise in the resistance value. By deleting the parallel components of the resistors coupling the Pwell with the substrate, the rise in the resistance value caused by the Deep Nwell can be reflected in the substrate parasitic-resistance extraction. Therefore, the accuracy of the substrate parasitic-resistance extraction can be improved.

6 Claims, 12 Drawing Sheets

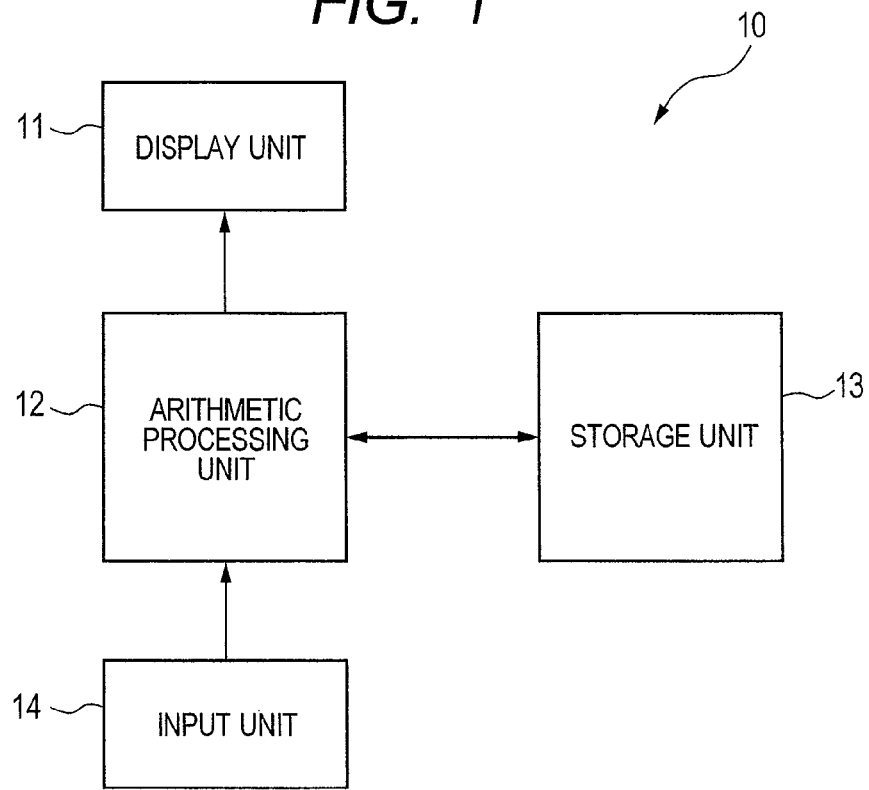
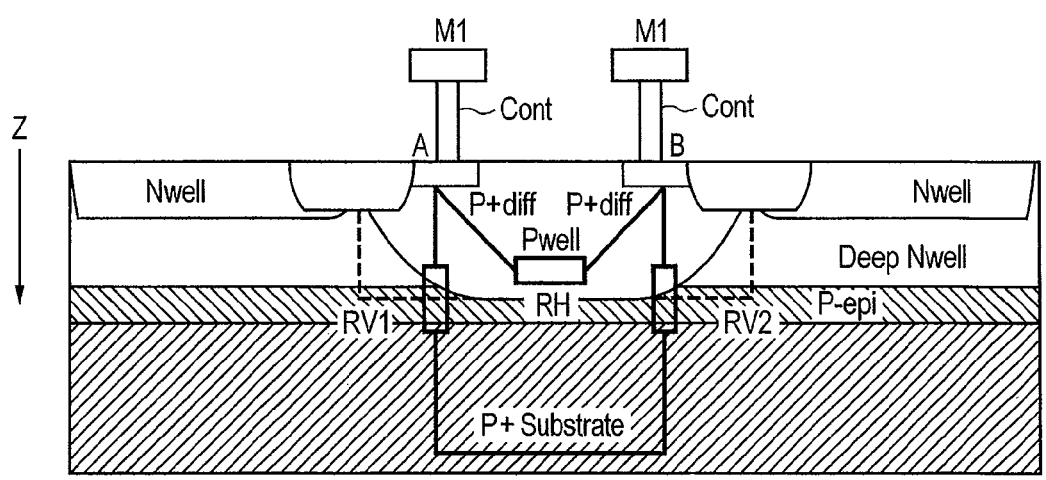

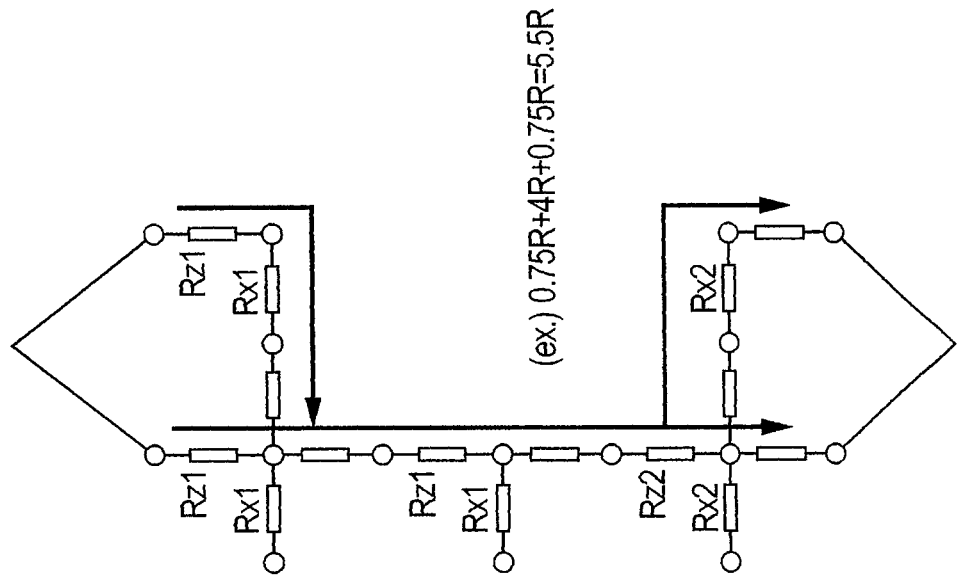
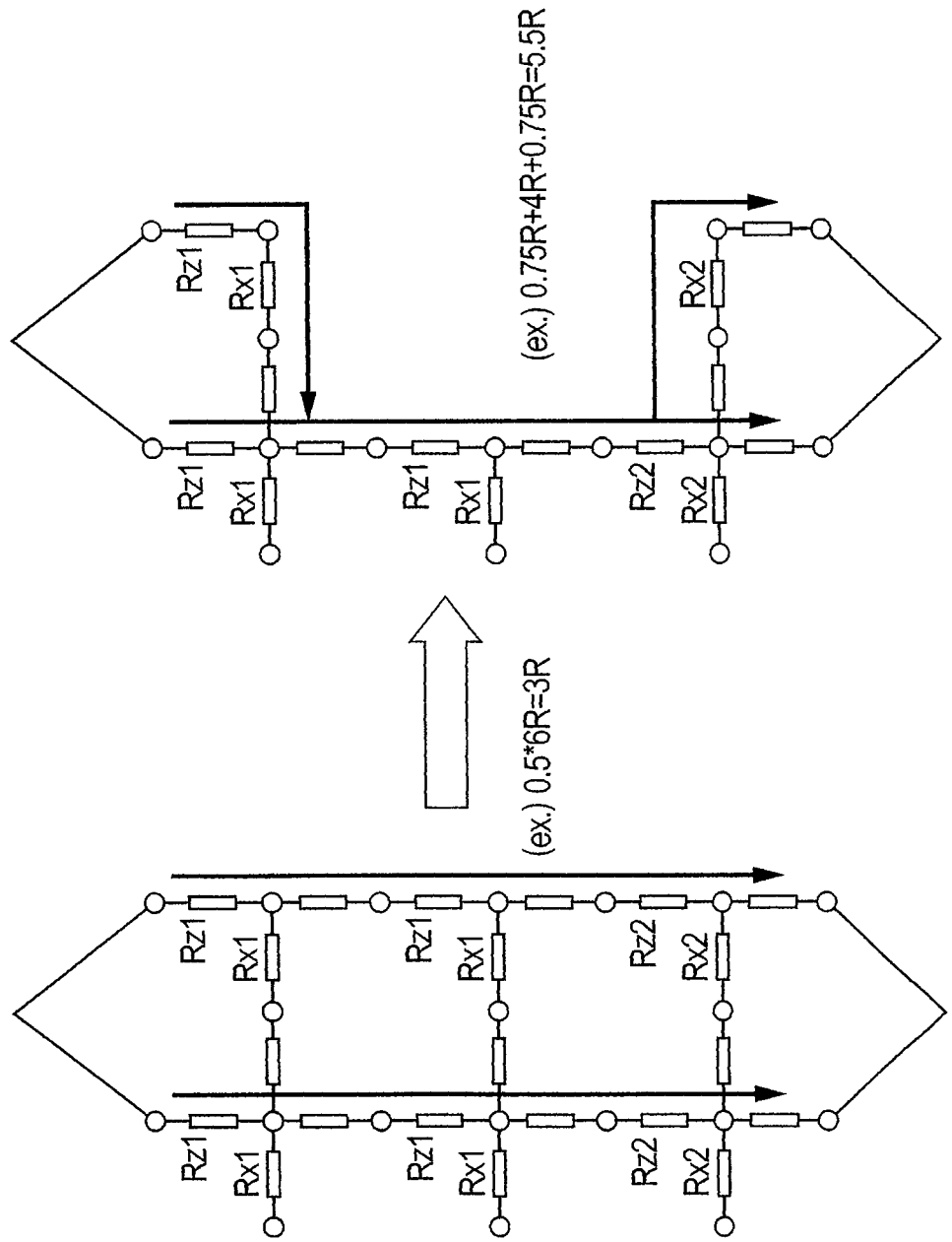

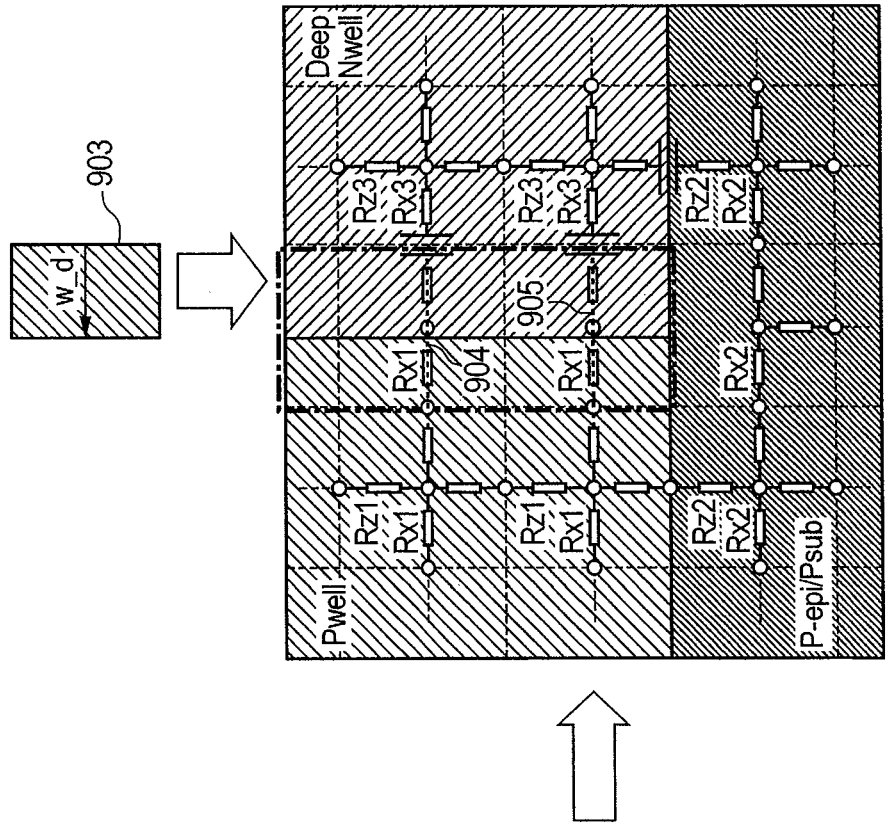
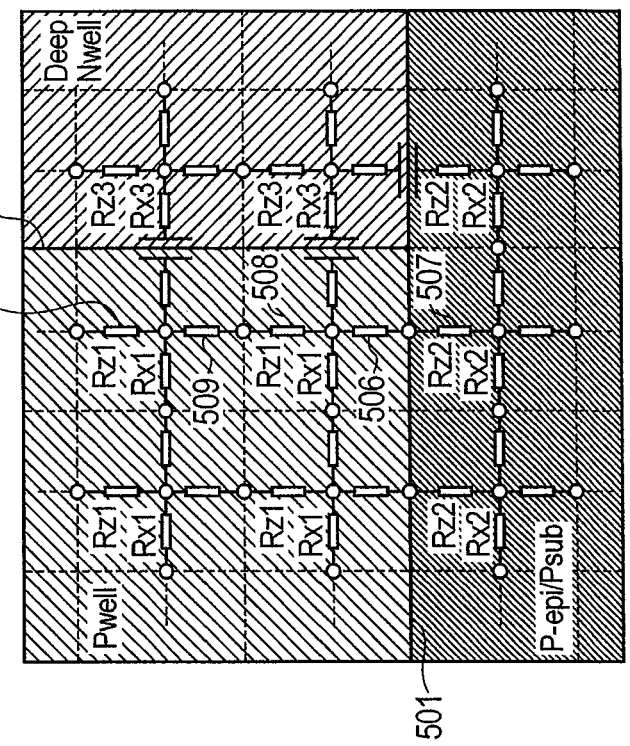

METHOD FOR IMPROVED ACCURACY OF A SUBSTRATE PARASITIC-RESISTANCE EXTRACTION IN A CIRCUIT SIMULATION

CROSS-REFERENCE TO RELATED APPLICATIONS

The disclosure of Japanese Patent Application No. 2011-271228 filed on Dec. 12, 2011 including the specification, drawings and abstract is incorporated herein by reference in its entirety.

BACKGROUND OF THE INVENTION

The present invention relates to a circuit simulation technology for extracting a resistance value and a capacitance value from layout data of a semiconductor integrated circuit and analyzing a noise transmitted through a semiconductor substrate.

Patent Document 1 discloses a simulation method and a device for precisely extracting parasitic elements resulting from a well region and a conductive region of a substrate and performing a circuit simulation. According to the above method and device, the well region is divided into meshes and is modeled using a two-dimensional parasitic resistance and capacitance network.

Patent Document 2 discloses an analyzing device for a semiconductor integrated circuit which performs circuit simulation including influences of parasitic elements in the semiconductor integrated circuit and a method for analyzing a substrate noise. According to the above device and method, behavior of a circuit element is modeled by using a three-dimensional mesh, access ports (well contacts) are simplified, and a load on the circuit simulation is reduced by forming a rough mesh.

Patent Document 3 relates to a noise coupling analysis in a mixed signal system. In particular, it discloses a method and a device for determining a noise in the mixed signal system. In Patent Document 3, "FIG. 2 SPICE substrate model" shows an equivalent circuit having a low-resistance substrate and a twin well configuration.

Patent Document 4 discloses a power MOSFET device formed in the low-resistance substrate.
[Patent Document 1]
Japanese Unexamined Patent Application Publication No. Hei 10(1998)-50849
[Patent Document 2]
Japanese Unexamined Patent Application Publication No. 2002-158284
[Patent Document 3]
United States Patent Application Publication No. 2002/0022951
[Patent Document 4]
Japanese Unexamined Patent Application Publication No. 2003-152180

SUMMARY OF THE INVENTION

During analysis of a noise transmitted through a semiconductor substrate, first, according to the layout information expressing a well form inside the semiconductor substrate, a well region is divided into two or more meshes each including two or more resistor segments. With respect to a unit mesh obtained through the division, a unit capacitance of a junction between a unit resistance and an adjacent well is calculated independently. By applying it to the mesh described above, a substrate RC network is generated. Based on the generated substrate RC network, substrate noise analysis of a MOS transistor is performed. When examining related-art substrate noise analysis, the present inventors found that, in a low-resistance substrate being principally used in LSI (Large Scale Integration) having a power MOS transistor and in a device configuration having a Deep Nwell layer (Triple well), for example, sufficient accuracy of substrate parasitic-resistance extraction could not be achieved. In this regard, explanations will be made with reference to FIG. 2.

FIG. 2 shows a cross-sectional view of a principal part of a semiconductor integrated circuit. "P+Substrate" represents a low-resistance substrate (for example, 10 mΩcm). A Pwell and a Deep Nwell are formed over the low-resistance substrate through a P epitaxial layer (P–epi). A diffusion layer (P+diff) is formed in the Pwell, and a metal wiring layer (M1) is coupled with it through a contact hole (Cont). An Nwell is formed over the Deep Nwell. In the case of a high-resistance substrate (for example, 10 Ωcm), with respect to an electric current which flows between terminals A and B, a current component flowing through a resistor component RH in a transverse direction in the Pwell is dominant. On the other hand, in the case of the low-resistance substrate (P+Substrate), it can be considered that the inside of the low-resistance substrate is substantially short-circuited. Therefore, the electric current which flows between the terminals A and B is defined by an electric current flowing through the resistor components RV1 and RV2 in a depth direction (a direction of arrow Z) of the semiconductor integrated circuit. In this regard, when the Deep Nwell is present, values of the resistors RV1 and RV2 are raised by the Deep Nwell diffusing into the Pwell region. However, in a related-art circuit simulation, a boundary between the Pwell region and the Deep Nwell is considered as a broken-line portion in FIG. 2. Therefore, a rise in the resistance value caused by the Deep Nwell diffusing into the Pwell region is not taken into account, being unable to achieve sufficient accuracy of substrate parasitic-resistance extraction.

It is an object of the present invention to improve accuracy of substrate parasitic-resistance extraction by considering the Deep Nwell diffusing into the Pwell region.

These and other objects and novel features of the invention may be readily ascertained by referring to the following description and appended drawings.

The following describes an overview of the representative aspects of the invention disclosed in this application.

That is, according to a circuit simulation method in which a well region of a semiconductor integrated circuit where a Pwell and a Deep Nwell are formed in a substrate is divided into two or more meshes each including two or more resistor segments and a substrate noise is analyzed based thereon, parallel components of resistors coupling the Pwell with the substrate are deleted in accordance with a state of the Deep Nwell diffusing into the Pwell region, so that an arithmetic processing unit is allowed to execute a process for expressing a rise in the resistance value.

The following summarizes effects provided by the representative aspects of the invention disclosed in this application.

That is, by considering the Deep Nwell diffusing into the Pwell region in the semiconductor integrated circuit, the accuracy of substrate parasitic-resistance extraction can be improved.

BRIEF DESCRIPTION OF THE DRAWINGS

FIG. 1 is a block diagram of a configuration of a computer system for implementing a circuit simulation method according to the present invention;

FIG. 2 is a cross-sectional view of a principal part of a semiconductor integrated circuit;

FIGS. 7A and 7B illustrate deletion of resistor segments which couple a Pwell region with a substrate;

FIGS. 9A and 9B illustrate deletion of resistor segments;

DESCRIPTION OF THE PREFERRED EMBODIMENTS

Figure 3:
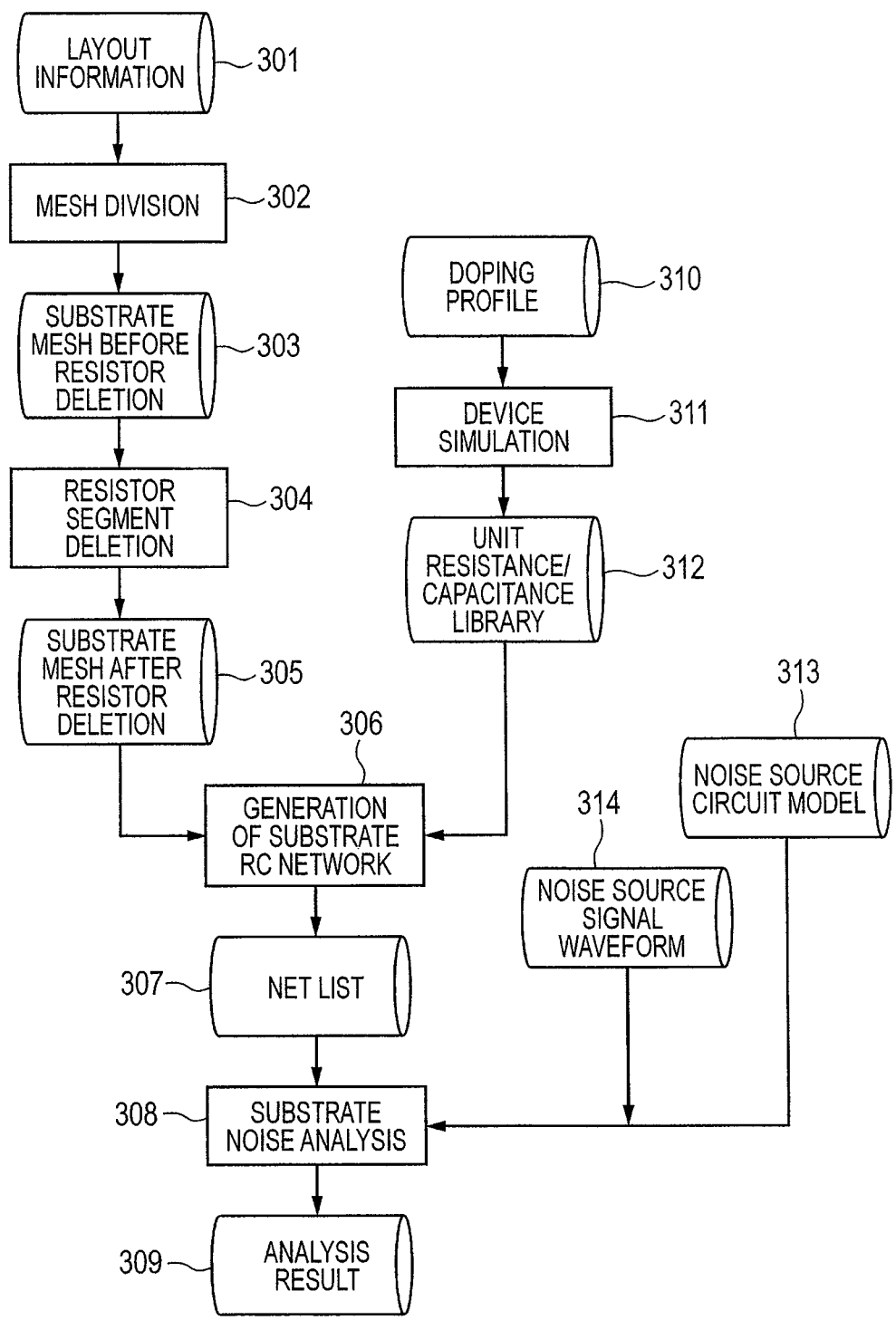
FIG. 3 is a flowchart which shows a flow of a circuit simulation performed by the computer system shown in FIG. 1.

1. Summaries of typical embodiments of the invention disclosed in the present application will first be shown. Reference numerals in the drawings that refer to with parentheses applied thereto in the description of the summaries of the typical embodiments are merely illustration of ones contained in the concepts of components marked with the reference numerals.

[1] In the circuit simulation method according to a typical embodiment of the present invention, a well region of a semiconductor integrated circuit where a Pwell and a Deep Nwell are formed in a substrate is divided into two or more meshes each including two or more resistor segments and a substrate noise is analyzed based thereon. In this regard, parallel components of resistors coupling the Pwell with the substrate are deleted in accordance with a state of the Deep Nwell diffusing into the Pwell region, so that an arithmetic processing unit (12) is allowed to execute a process for expressing a rise in the resistance value.

According to such a circuit simulation method, when the parallel components of the resistors for coupling the Pwell with the substrate are deleted, the rise in the resistance value caused by the Deep Nwell diffusing into the Pwell region can be reflected in the substrate parasitic-resistance extraction. Therefore, accuracy of the substrate parasitic-resistance extraction can be improved. Furthermore, as the substrate parasitic-resistance extraction accuracy is improved, the accuracy of the substrate noise analysis can be improved.

[2] In the above paragraph [1], the process for expressing the rise in the resistance value can be a resistor segment deleting process (304) in which, after the mesh division, resistor segments in a depth direction of the semiconductor substrate are deleted in a mesh corresponding to the Pwell region eroded by the diffusion of the Deep Nwell.

[3] In the above paragraph [2], the resistor segment deleting process can be a process for modeling the Deep Nwell region diffusing into the Pwell region by using a figure being in contact with a bottom and a side of the Pwell and, on the center line in a depth direction of a mesh obtained by the mesh dividing process, deleting the resistor segments in the depth direction of the mesh in accordance with an eroding state of the Deep Nwell.

[4] In the above paragraph [3], the figure is an arc being in contact with the bottom and the side of the Pwell. In this regard, when a half or more of the Deep Nwell region diffuses on the center line in the depth direction of the mesh obtained by the mesh dividing process, resistor segments in the depth direction of the mesh can be deleted.

[5] In the above paragraph [3], the figure is an arc being in contact with the bottom and the side of the Pwell. In this regard, when three quarters or more of the Deep Nwell region diffuse on the center line in the depth direction of the mesh obtained by the mesh dividing process, all the resistance segments in the depth direction of the mesh can be deleted.

[6] In the above paragraph [3], the figure is a rectangle being in contact with the bottom and the side of the Pwell. In this regard, when a half or more of the Deep Nwell region diffuses on the center line orthogonal to the depth direction of the mesh obtained by the mesh dividing process, resistor segments in the depth direction of the mesh can be deleted.

[7] In the above paragraph [1], the process for expressing the rise in the resistance value can be a process for performing under-resizing of the Pwell region before dividing the well region of the semiconductor integrated circuit into two or more meshes each including two or more resistor segments.

2. Detailed Description of the Exemplary Embodiments

Exemplary embodiments will be described further in detail.

First Embodiment

FIG. 1 shows a computer system for implementing a circuit simulation method according to the present invention.

The computer system 10 shown in FIG. 1 includes: a display unit 11; an arithmetic processing unit 12; a storage unit 13; and an input unit 14. The storage unit 13 is, for example, a hard disk drive which uses a magnetic disk as a recording medium. A program for circuit simulation and various kinds of information used for the circuit simulation are stored in the storage unit 13. The arithmetic processing unit 12 includes a microcomputer and peripheral circuits thereof, which can execute a circuit simulation program extracting a resistance value and a capacitance value from the layout data of a semiconductor integrated circuit and analyzing noise transmitted through a semiconductor substrate. The input unit 14 includes a keyboard and a mouse, and is used for inputting various kinds of information related to the circuit simulation. The display unit 11 is a liquid crystal display etc. and is capable of showing various kinds of information related to the circuit simulation.

FIG. 3 shows a flow of the circuit simulation performed by the arithmetic processing unit 12.

First, layout information of the semiconductor integrated circuit being a target of the circuit simulation is read from the storage unit 13 into the arithmetic processing unit 12. In this regard, the layout information of the semiconductor integrated circuit expresses a well form inside the semiconductor substrate. Based on the layout information, the arithmetic processing unit 12 divides the inside of the well into two or more two-dimensional or three-dimensional meshes (302). As a result of the mesh dividing process, the substrate mesh information (303) before the resistor deletion is obtained and is stored in the storage unit 13.

Figure 4:
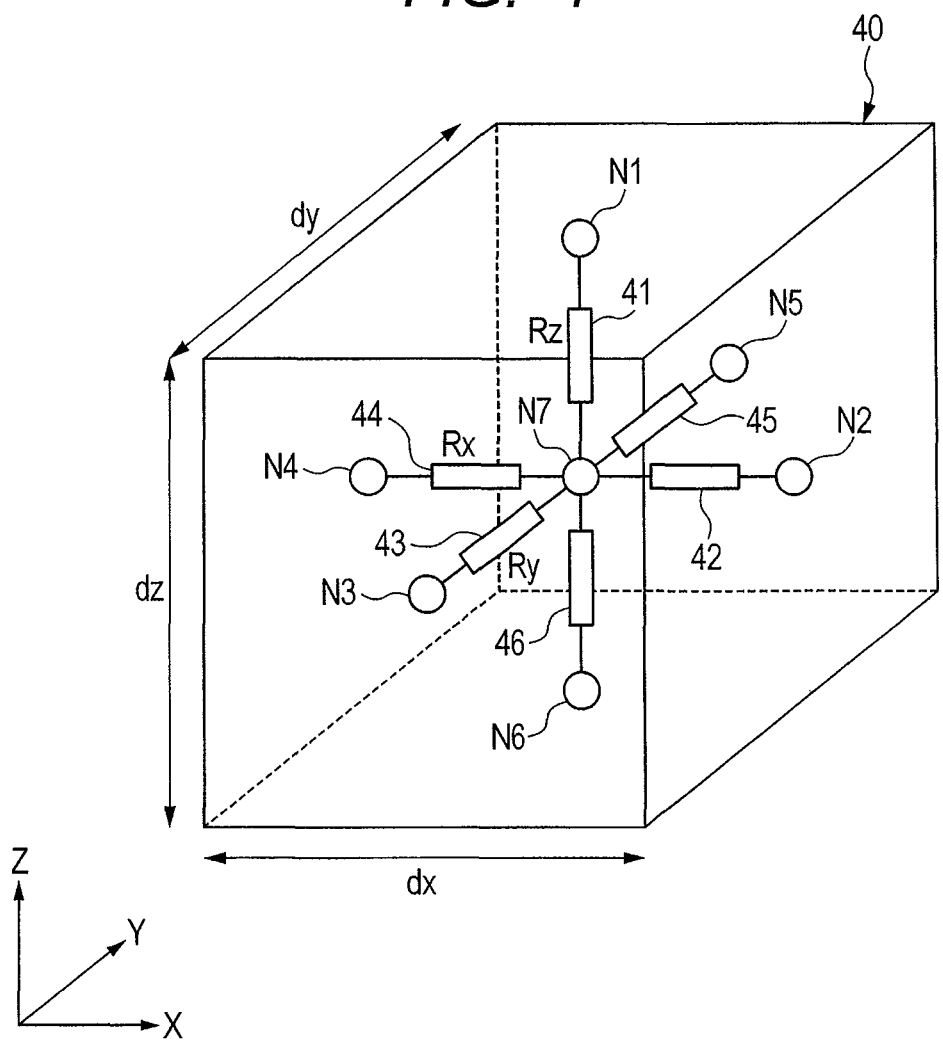
FIG. 4 illustrates a unit mesh obtained by a mesh dividing process.

FIG. 4 schematically shows one mesh (unit mesh) of the substrate mesh information (303) before the resistor deletion.

The unit mesh 40 shown in FIG. 4 includes seven nodes N1 to N7 and six resistor segments 41 to 46. The resistor segments 41 to 46 show corresponding resistors between the nodes, respectively. The resistor segments 41 to 46 in themselves include resistance components and capacitance components. However, when a dielectric relaxation time determined by resistivity and a dielectric constant of the substrate is faster than the velocity of the signal used in the circuit, capacitance components are omitted and approximation is performed using the resistance components alone. The resistance values of the resistor segments 41 to 46 are expressed using a resistivity ρ of the semiconductor substrate by the following formula (1). In addition, resistivity differs from portion to portion corresponding to the well, the diffusion, the epitaxial layer, etc., which are reflected in the resistance values.

$$Rx = \rho \cdot dx/(2 \cdot dy \cdot dz)$$

$$Ry = \rho \cdot dy/(2 \cdot dz \cdot dx)$$

$$Rz = \rho \cdot dz/(2 \cdot dx \cdot dy) \tag{1}$$

In this regard, Rx, Ry, and Rz show the resistance values of the resistor segments in the directions of three axes x, y, and z intersecting at right angles in FIG. 4, respectively.

Next, the arithmetic processing unit 12 deletes the resistor segments (304) using the substrate mesh information (303) before resistor deletion in the storage unit 13. The deletion of the resistor segments is performed as follows.

Figure 5B:
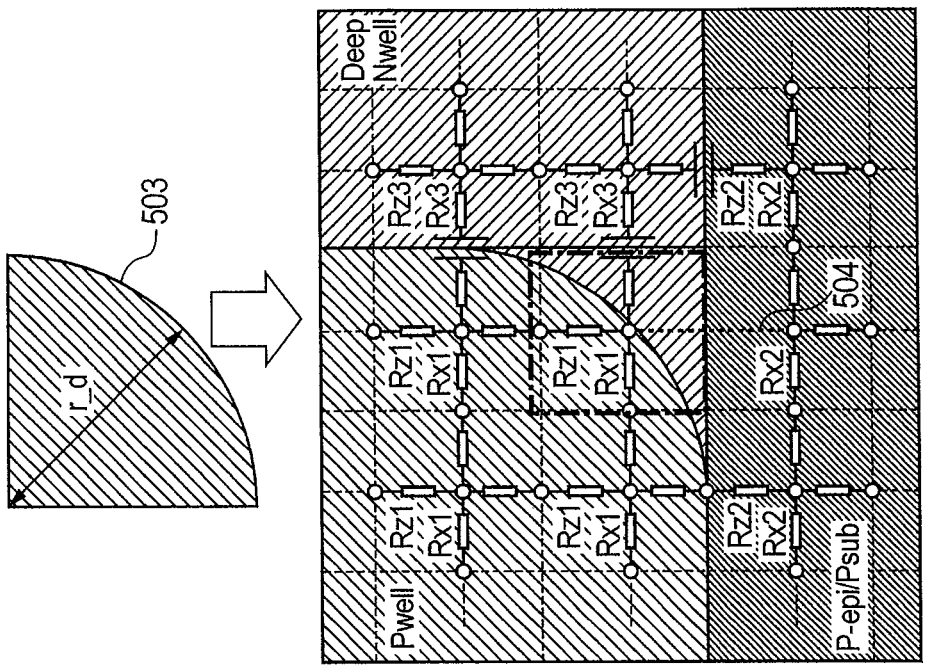
FIGS. 5A and 5B illustrate deletion of resistor segments.
Figure 5A:
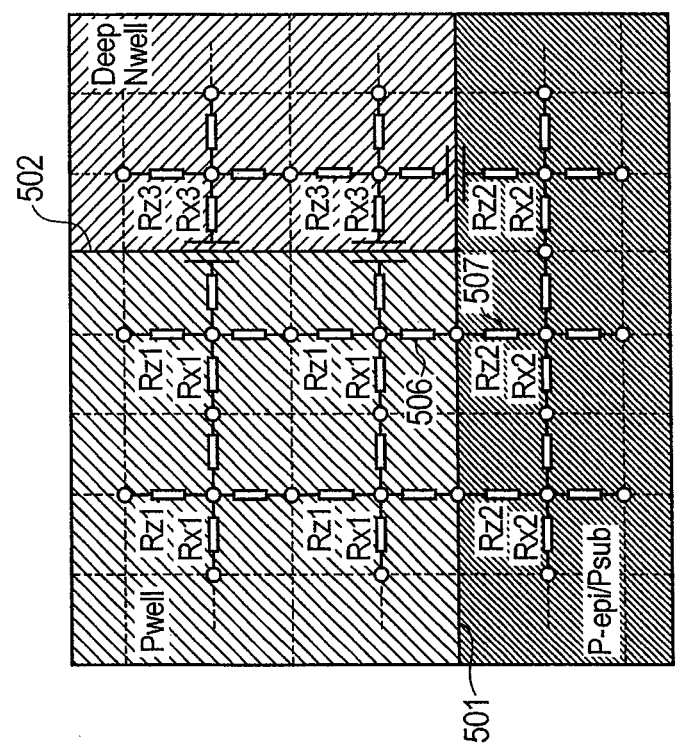

FIGS. 5A and 5B show how the resistor segments are deleted. FIG. 5A shows a state before deletion of the resistor segments, and FIG. 5B shows a state after deletion of the resistor segments.

"Pwell" shows a Pwell and "Deep Nwell" shows a Deep Nwell. "P–epi/Psub" corresponds to a low-resistance substrate (P+Substrate) and a P epitaxial layer (P–epi) in FIG. 2.

In the resistor segment deleting process in step 304, first, the Deep Nwell region diffusing into the Pwell is modeled by an arc 503 having a radius r_d being in contact with the bottom 501 and the side 502 of the Pwell. The radius r_d can be calculated by using an actually measured resistance value or by device simulation.

Subsequently, when a half or more of the Deep Nwell diffuses on a center line 504 in a depth direction (a direction of arrow Z in FIG. 4) of the mesh obtained by the mesh division of the step 302, the resistor segments in the depth direction of the mesh are deleted. Moreover, in a mesh adjacent to the mesh from which the resistor segments are deleted, when there is a resistor segment directly coupled to the resistor segment concerning the above deletion, such a resistor segment is also deleted collectively. In the example shown in FIGS. 5A and 5B, on the center line 504 in the depth direction (the direction of arrow Z in FIG. 4) of the mesh, the resistor segment 506 of the depth-direction component where the half or more of the Deep Nwell diffuses is deleted. Further, in a mesh adjacent to the mesh from which the resistor segments are deleted, a resistor segment 507 directly coupled to the resistor segment 506 concerning the above deletion is also deleted.

Figures 6A, 6B:
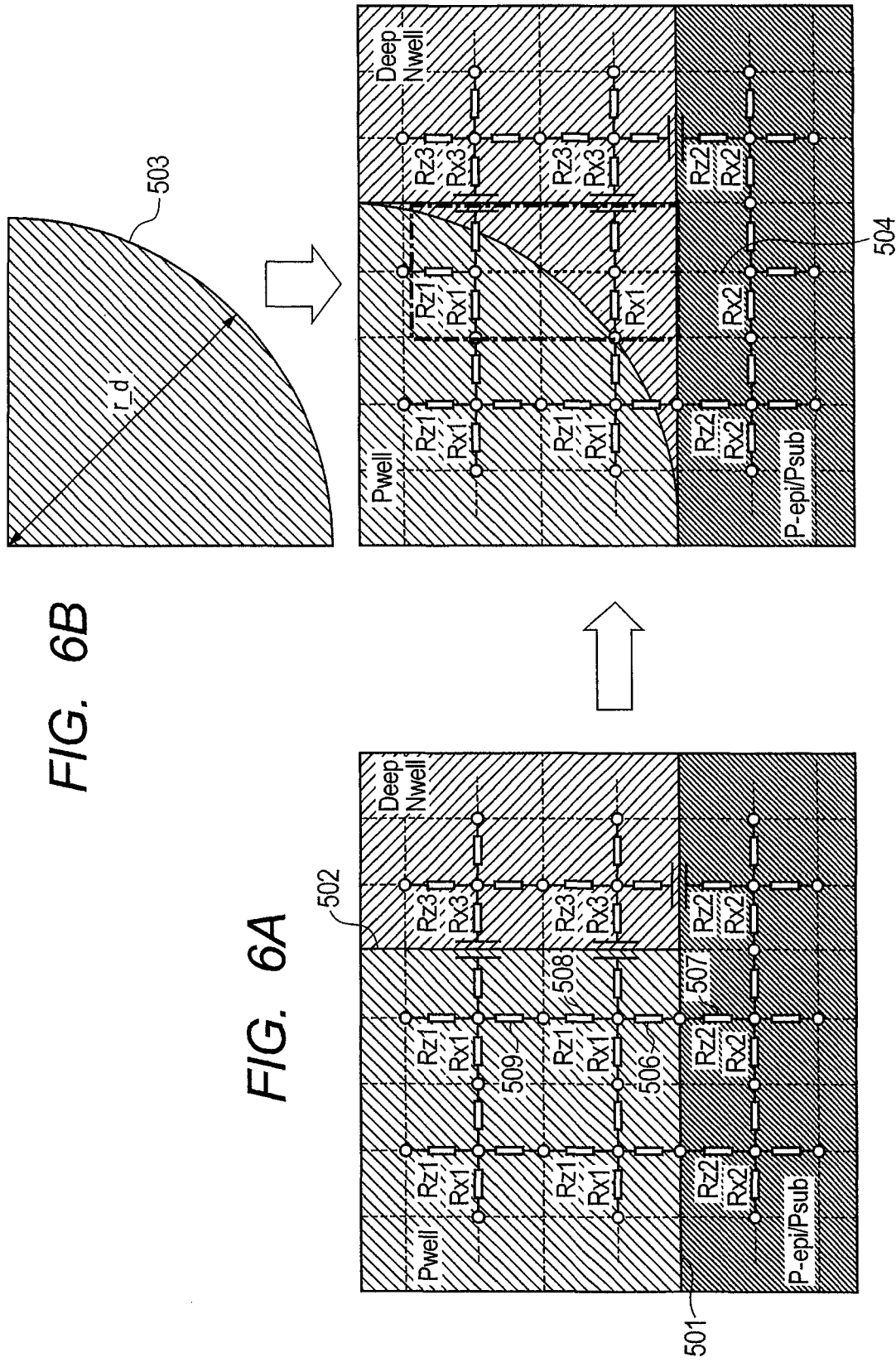
FIGS. 6A and 6B illustrate deletion of resistor segments.

Moreover, when three quarters or more of the Deep Nwell diffuse on the center line 504 in the depth direction (the direction of arrow Z in FIG. 4) of the mesh obtained by the mesh division in step 302, both the two resistor segments in the depth direction of the mesh are deleted. Also, in the vertically adjoining meshes, resistor segments of the depth-direction components are deleted. For instance, in the example shown in FIGS. 6A and 6B, three quarters or more of the entire Deep Nwell diffuse on the center line 504 in the depth direction (the direction of arrow Z in FIG. 4) of the mesh. In such a case, both the two resistor segments 506 and 508 of the depth-direction components are deleted. Also, the resistor segments 509 and 507 of the depth-direction components in the vertically adjoining meshes are deleted collectively.

FIGS. 7A and 7B show resistor segments for coupling the Pwell region with the substrate.

FIG. 7A shows a state (corresponding to FIG. 6A) before deletion of the resistor segments, and FIG. 7B shows a state (corresponding to FIG. 6B) after deletion of the resistor segments.

In the state before deletion of the resistor segments, a composite value of the resistor segments for coupling the Pwell region with the substrate is expressed by, for example, 0.5×6R=3R. However, in the state after deletion of the resistor segments, the value is expressed by: 0.75R+4R+0.75R=5.5R, being greater than the one before deletion of the resistor segments. In other words, there is considered a rise in the resistance value resulting from the Deep Nwell diffusing into the Pwell region.

Thus, substrate mesh information 305 after the resistor deletion is obtained. The substrate mesh information 305 is stored in the storage unit 13. Then, in the arithmetic processing unit 12, a doping profile 310 in the storage unit 13 is referred to and a device simulation is performed (311). Further, a unit capacitance of a junction between a unit resistance and an adjacent well is calculated, and a unit resistance/capacitance library 312 is formed. The unit resistance/capacitance library 312 is stored in the storage unit 13. Moreover, in the arithmetic processing unit 12, there are referred to the substrate mesh information 305 after the resistor deletion and the unit resistance/capacitance library 312 in the storage unit 13, and a substrate RC network is generated (306). In the generation process of the substrate RC network, the unit resistance and the unit capacitance in the unit resistance/capacitance library 312 are applied to the substrate mesh after the resistor deletion. The result of the processing is stored in the storage unit 13 as a net list 307. Furthermore, in the arithmetic processing unit 12, based on the net list 307, noise source signal waveform information 314, and a noise source circuit model 313 in the storage unit 13, a substrate noise analysis is performed (308) and the analysis result 309 is stored in the storage unit 13.

According to the first embodiment, the following operational effects can be obtained.

(1) In the resistor segment deletion in step 304, the Deep Nwell region diffusing into the Pwell is modeled by using the arc 503 having the radius r_d being in contact with the bottom 501 and the side 502 of the Pwell and, when the half or more of the Deep Nwell diffuses on the center line 504 in the depth direction (the direction of arrow Z in FIG. 4) of the mesh obtained by the mesh division in step 302, the resistor segments in the depth direction of the mesh are deleted. Moreover, in a mesh adjacent to the mesh from which the resistor segments are deleted, when there is a resistor segment directly coupled to the resistor segment concerning the above deletion, such a resistor segment is also deleted collectively. When the resistor segments are deleted in this way, there can be reflected in the substrate parasitic-resistance extraction a rise in the resistance value caused by the Deep Nwell diffusing into the Pwell region, making it possible to improve accuracy of the substrate parasitic-resistance extraction.

(2) Further, when three quarters or more of the Deep Nwell diffuse on the center line 504 in the depth direction (the direction of arrow Z in FIG. 4) of the mesh obtained by the mesh division in step 302, both the two resistor segments of the depth-direction components are deleted. Also, the resistor segments of the depth-direction components in the vertically adjoining meshes are deleted. When the resistor segments are deleted in this way, there can be reflected in the substrate parasitic-resistance extraction a rise in the resistance value caused by the Deep Nwell diffusing into the Pwell region, making it possible to improve accuracy of the substrate parasitic-resistance extraction.

(3) Because of the operational effects of (1) and (2), accuracy of the substrate noise analysis in step 308 can be improved.

Second Embodiment

Figure 8:
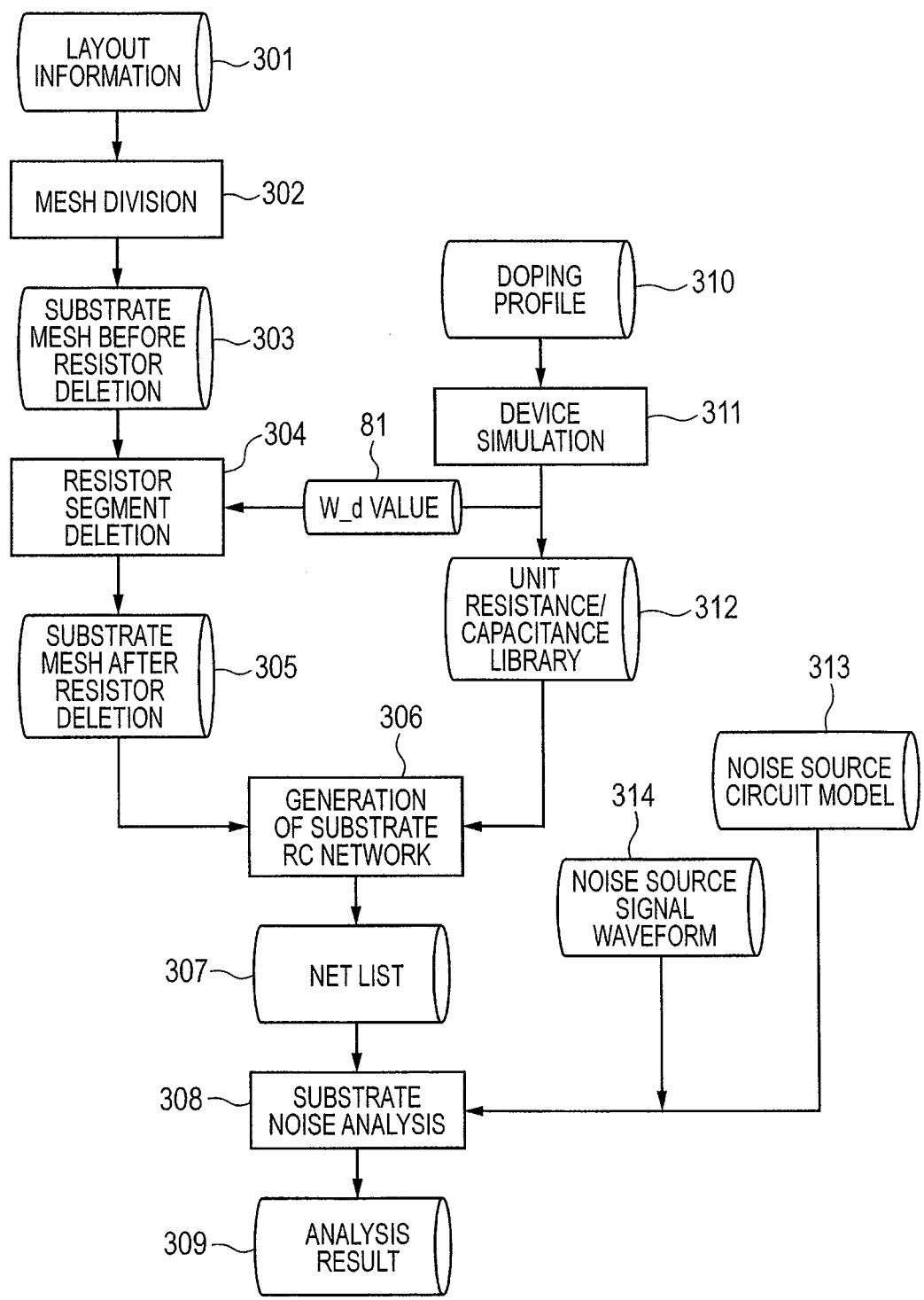
FIG. 8 is a flowchart which shows a flow of the circuit simulation performed by the computer system shown in FIG. 1.

FIG. 8 is a flowchart showing another flow of the circuit simulation performed by the computer system 10.

The circuit simulation of FIG. 8 greatly differs from the circuit simulation of FIG. 3 in that the Wd value is found by using device simulation 311 and W_d value information 81 is referred to in the resistor segment deleting process 304 executed in the arithmetic processing unit 12. The resistor segment deleting process 304 executed in the arithmetic processing unit 12 is performed as follows.

FIGS. 9A and 9B show how the resistor segments are deleted. FIG. 9A shows a state before deletion of the resistor segments, and FIG. 9B shows a state after deletion of the resistor segments. "P-epi/Psub" corresponds to the low-resistance substrate (P+Substrate) and the P epitaxial layer (P-epi) in FIG. 2.

In the resistor segment deleting process of step 304 in FIG. 8, first, the Deep Nwell region diffusing into the Pwell is modeled by a rectangle 903 having a width W_d being in contact with the bottom 501 and the side 502 of the Pwell. The value of the width W_d is obtained by referring to the W_d value information 81.

Subsequently, on each of the center lines 904 and 905 orthogonal to the depth direction (the direction of arrow Z in FIG. 4) of the mesh obtained by dividing the mesh in step 302, resistor segments of the depth-direction components where the half or more of the Deep Nwell diffuses are deleted. In the example shown in FIGS. 9A and 9B, resistor segments 506, 508, 509, and 906 are deleted. Moreover, in a mesh adjacent to the mesh from which the resistor segments are deleted, when there is a resistor segment directly coupled to the resistor segment concerning the above deletion, such a resistor segment is also deleted collectively. In the example shown in FIGS. 9A and 9B, a resistor segment 507 is deleted.

Figures 11A, 11B:
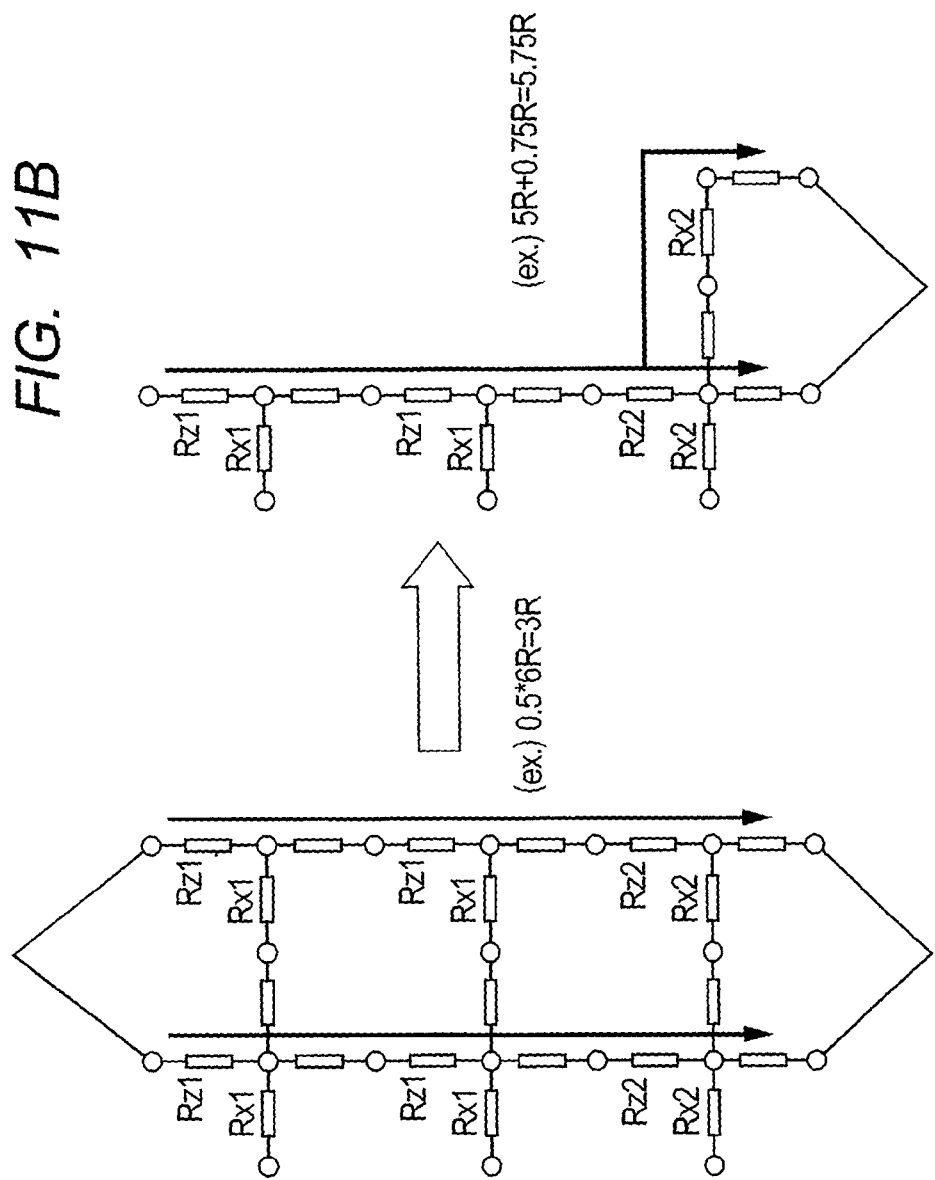
FIGS. 11A and 11B illustrate deletion of resistor segments which couple the Pwell region with the substrate.

FIG. 11A shows a state (corresponding to FIG. 9A) before deletion of the resistor segments, and FIG. 11B shows a state (corresponding to FIG. 9B) after deletion of the resistor segments.

In the state before deletion of the resistor segments, a composite value of the resistor segments for coupling the Pwell region with the substrate is expressed by, for example, 0.5×6R=3R. However, in the state after deletion of the resistor segments, the value is expressed by: 5R+0.75R=5.75R, being greater than the one before deletion of the resistor segments. In other words, there is considered a rise in the resistance value resulting from the Deep Nwell diffusing into the Pwell region. Therefore, in the substrate noise analysis of the second embodiment also, there is considered the rise in the resistance value caused by the Deep Nwell by reflecting the result of the resistor segment deletion in step 304. As a result of this, sufficient accuracy of substrate parasitic-resistance extraction can be achieved.

Figure 10:
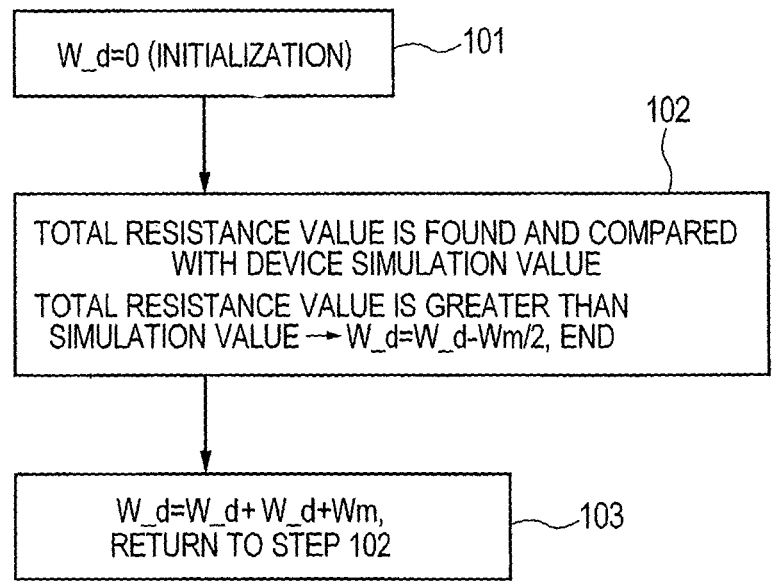
FIG. 10 is a flowchart of a process for obtaining W_d value information.

In the device simulation in step 311, the W_d value information 81 can be obtained as shown in FIG. 10.

W_d represents an effective diffusion width of the Nwell, and Wm represents a mesh size.

First, the initial condition is set as W_d=0 (101). Then, a total resistance value is calculated, and it is compared with a device simulation value (102). In this regard, the "total resistance value" means the composite value of the resistor segments which couple the Pwell region with the substrate. In the comparison in step 102, when the total resistance value is equal to or smaller than the device simulation value, W_d is updated to "W_d+W_d+Wm" and the process returns to the comparison in step 102. Also, in the comparison in step 102, when the total resistance value is greater than the device simulation value, W_d is updated to "W_d−Wm/2", and the process is ended. Thus, the W_d value information 81 is obtained.

As described above, according to the second embodiment, the Deep Nwell region diffusing into the Pwell is modeled by using the rectangle 903 having the width W_d being in contact with the bottom 501 and the side 502 of the Pwell and, when a half or more of the deep Nwell region diffuses on the center lines 904 and 905 orthogonal to the depth direction (the direction of arrow Z in FIG. 4) of the mesh obtained by the mesh division in step 302, resistor segments of the depth-direction components are deleted, respectively. Moreover, in a mesh adjacent to the mesh from which the resistor segments are deleted, when there is a resistor segment directly coupled to the resistor segment concerning the above deletion, such a resistor segment is also deleted collectively. When the resistor segments are deleted in this way, there can be reflected in the substrate parasitic-resistance extraction a rise in the resistance value caused by the Deep Nwell diffusing into the Pwell region, making it possible to improve the accuracy of the substrate parasitic-resistance extraction. Accordingly, as in the first embodiment, accuracy of the substrate noise analysis can be improved.

Third Embodiment

Figure 12:
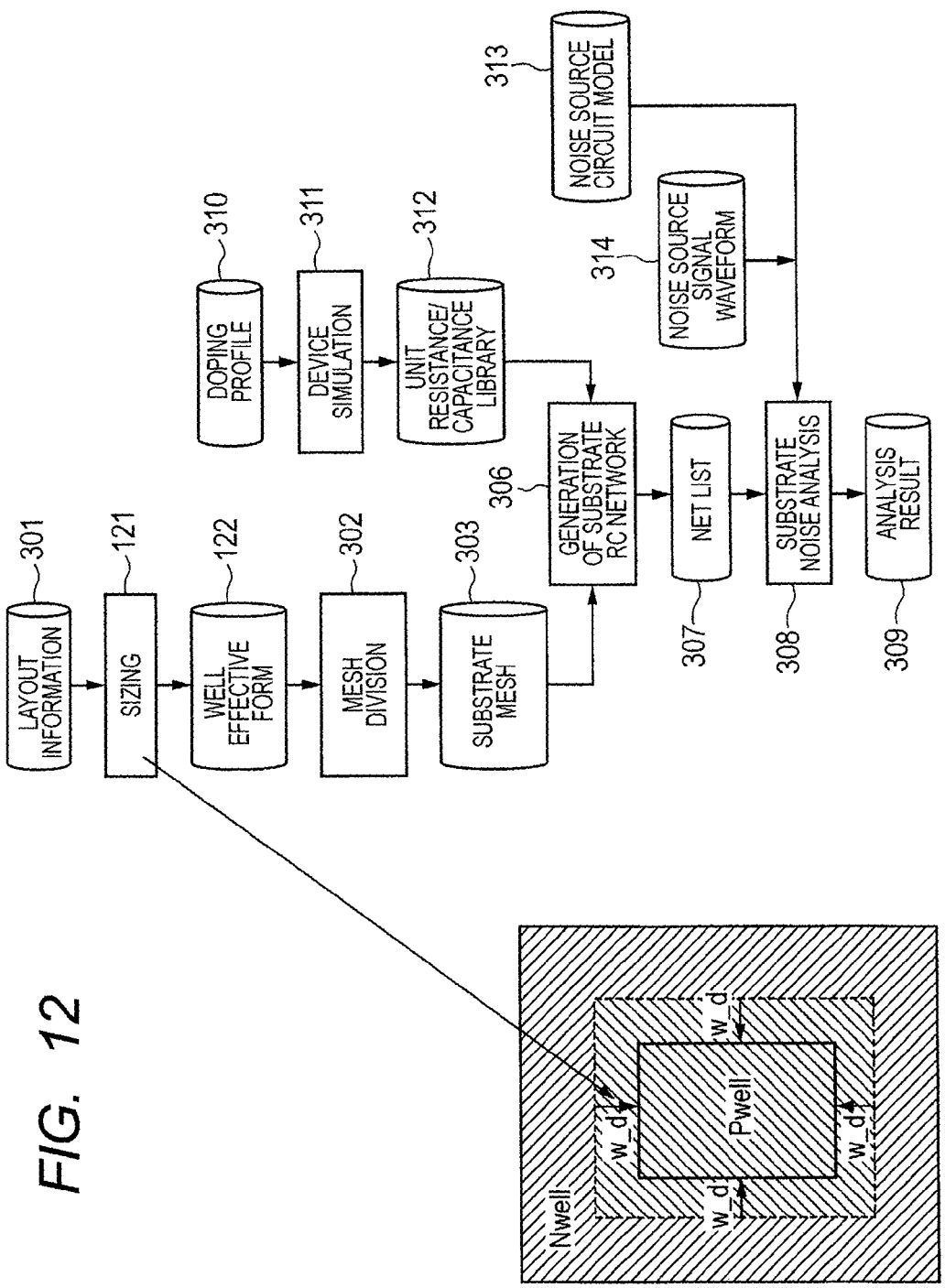
FIG. 12 is a flowchart which shows a flow of the circuit simulation performed by the computer system shown in FIG. 1.

FIG. 12 shows another flow of the circuit simulation performed by the arithmetic processing unit 12.

The circuit simulation in FIG. 12 greatly differs from the one shown in FIG. 3 in that a sizing process 121 is executed with reference to the layout information 301 and in that the mesh dividing process (302) is executed with reference to the well effective form information obtained by the sizing process 121. Further, in the third embodiment, since the sizing process (121) is executed, the resistor segment deletion (304) is not performed.

In the sizing process in step 121, under-resizing of the Pwell region is performed by using the effective diffusion width W_d of the Nwell. The effective diffusion width W_d of the Nwell is the same as the one obtained in the second embodiment.

Figure 13:
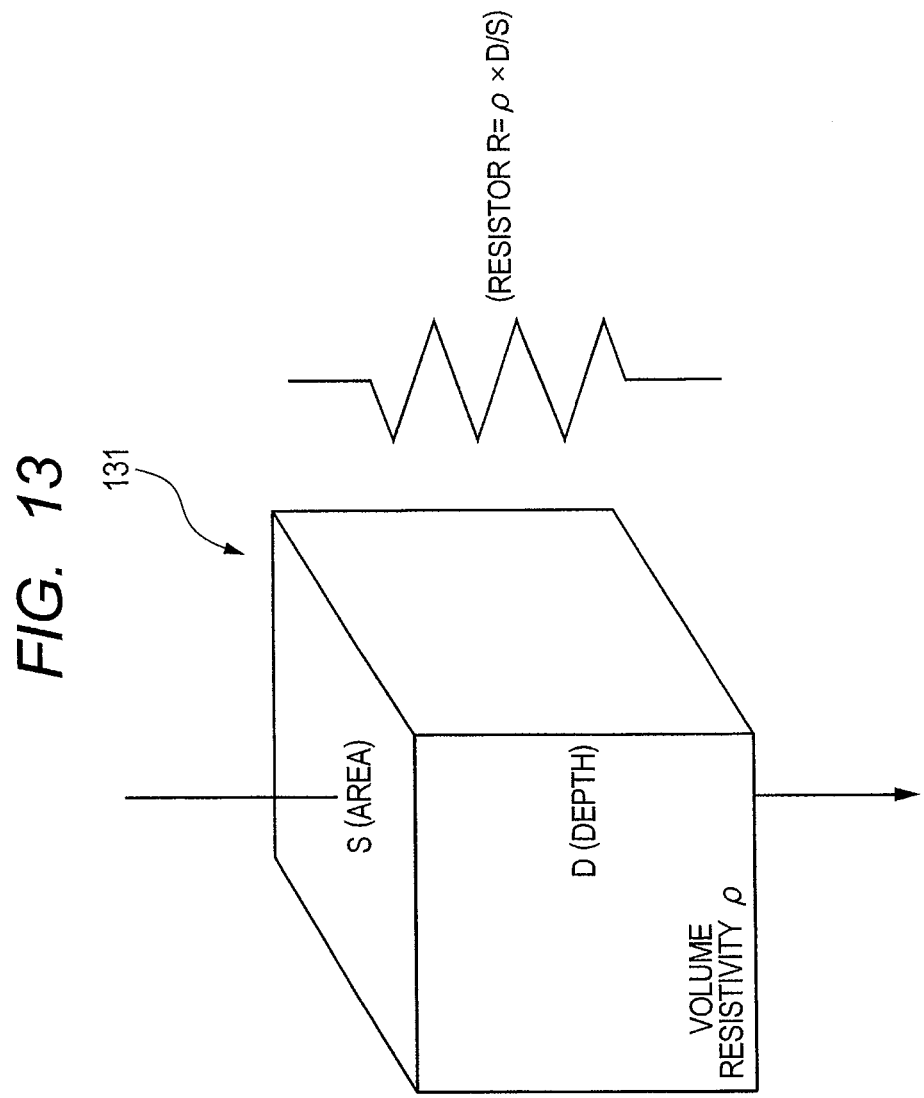
FIG. 13 illustrates a rise in the resistance value caused by a sizing process.

Thus, when the Pwell region is reduced in area, as in the cases of the first and second embodiments, there can be expressed a rise in the composite value of the resistor segments which couple the Pwell region with the substrate. For example, as shown in FIG. 13, when the sizing (under size) amount is ΔS, the area S of the unit mesh 40 is reduced by ΔS due to the sizing. As a result, the composite value R' of the resistor segments which couple the Pwell region with the substrate is expressed by: ρ×D/(S−ΔS), being greater than the resistance value R before the sizing. Thus, when the Pwell region is reduced in accordance with the effective diffusion width W_d of the Nwell, as in the first and second embodiments, the rise in the composite value of the resistor segments coupling the Pwell region with the substrate can be expressed. Therefore, as in the first and second embodiments, it becomes possible to improve the accuracy of the substrate noise analysis as well as the accuracy of the substrate parasitic-resistance extraction.

While the invention made by the present inventors has been specifically described in terms of embodiments, the invention is not limited to the embodiments described above but can be practiced with various modifications within the spirit and scope thereof.

What is claimed is:

1. A circuit simulation method comprising:
dividing a well region of a semiconductor integrated circuit where a Pwell and a Deep Nwell are formed in a substrate into two or more meshes each including two or more resistor segments; and analyzing a substrate noise of the substrate,
wherein parallel components of resistors coupling said Pwell with said substrate are deleted in accordance with a state of said Deep Nwell diffusing into said Pwell region, so that an arithmetic processing unit executes a process for expressing a rise in the resistance value,
wherein said process for expressing the rise in the resistance value is a resistor segment deleting process in which, after said mesh division, resistor segments in a depth direction of said semiconductor substrate are deleted in a mesh corresponding to said Pwell region eroded by the diffusion of said Deep Nwell.

2. A circuit simulation method according to claim 1, wherein, said resistor segment deleting process is a process for modeling said Deep Nwell region diffusing into said Pwell region by using a figure being in contact with a bottom and a side of the Pwell and, on the center line in a depth direction of a mesh obtained by said mesh dividing process, deleting the resistor segments in the depth direction of the mesh in accordance with an eroding state of said Deep Nwell.

3. A circuit simulation method according to claim 2, wherein said figure is an arc being in contact with the bottom and the side of the Pwell and, when a half or more of said Deep Nwell region diffuses on the center line in the depth direction of the mesh obtained by said mesh dividing process, resistor segments in the depth direction of the mesh are deleted.

4. A circuit simulation method according to claim 2, wherein said figure is an arc being in contact with the bottom and the side of the Pwell and, when three quarters or more of said Deep Nwell region diffuse on the center line in the depth direction of the mesh obtained by said mesh dividing process, all the resistor segments in the depth direction of the mesh are deleted.

5. A circuit simulation method according to claim 2, wherein said figure is a rectangle being in contact with the bottom and the side of the Pwell and, when a half or more of said deep Nwell region diffuses on the center line orthogonal to the depth direction of the mesh obtained by said mesh dividing process, resistor segments in the depth direction of the mesh are deleted.

6. A circuit simulation method comprising:
dividing a well region of a semiconductor integrated circuit where a Pwell and a Deep Nwell are formed in a substrate into two or more meshes each including two or more resistor segments; and analyzing a substrate noise of the substrate; and
executing a process for expressing a rise in the resistance value,
wherein said process for expressing the rise in the resistance value is a process for performing under-resizing of said Pwell region based on an effective diffusion width of said Nwell before dividing the well region of said semiconductor integrated circuit into two or more meshes each including two or more resistor segments.

* * * * *